United States Patent
Shibusawa et al.

(10) Patent No.: US 8,632,212 B2
(45) Date of Patent: Jan. 21, 2014

(54) LIGHT-EMITTING DEVICE AND ILLUMINATION DEVICE

(75) Inventors: Soichi Shibusawa, Yokosuka (JP); Kozo Ogawa, Yokosuka (JP); Kiyoshi Nishimura, Yokosuka (JP); Nobuhiko Betsuda, Yokosuka (JP)

(73) Assignee: Toshiba Lighting & Technology Corporation, Kanagawa (JP)

( * ) Notice: Subject to any disclaimer, the term of this patent is extended or adjusted under 35 U.S.C. 154(b) by 76 days.

(21) Appl. No.: 13/024,384

(22) Filed: Feb. 10, 2011

(65) Prior Publication Data

US 2011/0199766 A1 Aug. 18, 2011

(30) Foreign Application Priority Data

Feb. 12, 2010 (JP) ................................ 2010-029544
Jan. 28, 2011 (JP) ................................ 2011-016408

(51) Int. Cl.
*F21S 4/00* (2006.01)

(52) U.S. Cl.
USPC ................. 362/249.01; 362/249.02; 362/267; 362/268

(58) Field of Classification Search
USPC ............... 362/249.01, 235, 249.02, 267, 268
See application file for complete search history.

(56) References Cited

U.S. PATENT DOCUMENTS

| | | | | |
|---|---|---|---|---|
| 7,021,799 B2* | 4/2006 | Mizuyoshi | ................... | 362/373 |
| 7,188,970 B2* | 3/2007 | Cleaver et al. | ............... | 362/219 |
| 2005/0285926 A1 | 12/2005 | Mizuyoshi | | |
| 2007/0097684 A1 | 5/2007 | Obara et al. | | |
| 2007/0176198 A1 | 8/2007 | Lee et al. | | |
| 2008/0068862 A1* | 3/2008 | Shimura | ....................... | 362/619 |
| 2008/0117619 A1* | 5/2008 | Pang et al. | ...................... | 362/84 |
| 2008/0128739 A1 | 6/2008 | Sanpei et al. | | |
| 2008/0273327 A1* | 11/2008 | Wilcox et al. | ................. | 362/267 |
| 2009/0103325 A1* | 4/2009 | Dubuc | .......................... | 362/555 |
| 2010/0047937 A1 | 2/2010 | Lee et al. | | |
| 2010/0188852 A1 | 7/2010 | Sanpei et al. | | |
| 2010/0277914 A1* | 11/2010 | Bachl et al. | ............. | 362/249.01 |
| 2011/0050071 A1 | 3/2011 | Chung et al. | | |
| 2011/0175548 A1 | 7/2011 | Nishimura et al. | | |
| 2011/0182073 A1 | 7/2011 | Sanpei et al. | | |
| 2012/0201028 A1 | 8/2012 | Sanpei et al. | | |

FOREIGN PATENT DOCUMENTS

| | | |
|---|---|---|
| CN | 1846318 | 10/2006 |
| CN | 201302063 | 8/2009 |
| EP | 1 670 072 | 6/2006 |
| EP | 1 928 026 | 6/2008 |
| EP | 2 290 276 | 3/2011 |

(Continued)

OTHER PUBLICATIONS

Chinese Office Action issued in CN 201110037800.7 mailed Oct. 8, 2012.

(Continued)

*Primary Examiner* — Evan Dzierzynski
(74) *Attorney, Agent, or Firm* — DLA Piper LLP (US)

(57) ABSTRACT

According to one embodiment, a light-emitting device comprises a substrate on which a plurality of light-emitting elements are arranged and mounted in two lines; and sealing members of two lines each sealing the plurality of light-emitting elements of each line. A distance between the lines of the sealing members is equal to 0.5 times or more but 2 times or less a width of the sealing member of each line.

12 Claims, 14 Drawing Sheets

(56) References Cited

FOREIGN PATENT DOCUMENTS

| EP | 2 346 307 | 7/2011 |
|----|-----------|--------|
| JP | 06-318734 | 11/1994 |
| JP | 2006-351708 | 12/2006 |
| JP | 2008-085302 | 4/2008 |
| JP | 2008-166081 | 7/2008 |
| JP | 2009-054989 | 3/2009 |
| JP | 2009-218204 | 9/2009 |
| JP | 2010-010681 | 1/2010 |

OTHER PUBLICATIONS

English Language Translation of Chinese Office Action issued in CN 201110037800.7 mailed Oct. 8, 2012.
English Language Abstract of JP 2006-351708 published Dec. 28, 2006.
English Language Translation of JP 2006-351708 published Dec. 28, 2006.
English Language Abstract of CN 1846318 published Oct. 11, 2006.
English Abstract of JP 2008-085302 published Apr. 10, 2008.
English Translation of JP 2008-085302 published Apr. 10, 2008.
English Abstract of JP 2009-054989 published Mar. 12, 2009.
English Translation of JP 2009-054989 published Mar. 12, 2009.
English Abstract of JP 2008-166081 published Jul. 17, 2008.
English Translation of JP 2008-166081 published Jul. 17, 2008.
Image File Wrapper of related U.S. Appl. No. 13/024,376 electronically captured on Aug. 22, 2013.
Extended European Search Report issued in EP 11154161.1 dated May 5, 2013.
English Language Abstract of CN1846318 published Sep. 2, 2009.
Partial Image File Wrapper of related U.S. Appl. No. 13/024,376 electronically captured on May 6, 2013 between Feb. 4, 2013 and May 6, 2013.
English Language Abstract of CN 201302063 published Sep. 2, 2009.
Japanese Office Action issued in JP 2010-029544 on Jun. 25, 2013.
English Translation of Japanese Office Action issued in JP 2010-029544 on Jun. 25, 2013.
English Language Abstract of JP 06-318734 published Nov. 15, 1994.
English Language Translation of JP 06-318734 published Nov. 15, 1994.
English Language Abstract of JP 2010-010681 published Jan. 14, 2010.
English Language Translation of JP 2010-010681 published Jan. 14, 2010.
English Language Abstract of JP 2009-218204 published Sep. 24, 2009.
English Language Translation of JP 2009-218204 published Sep. 24, 2009.

* cited by examiner

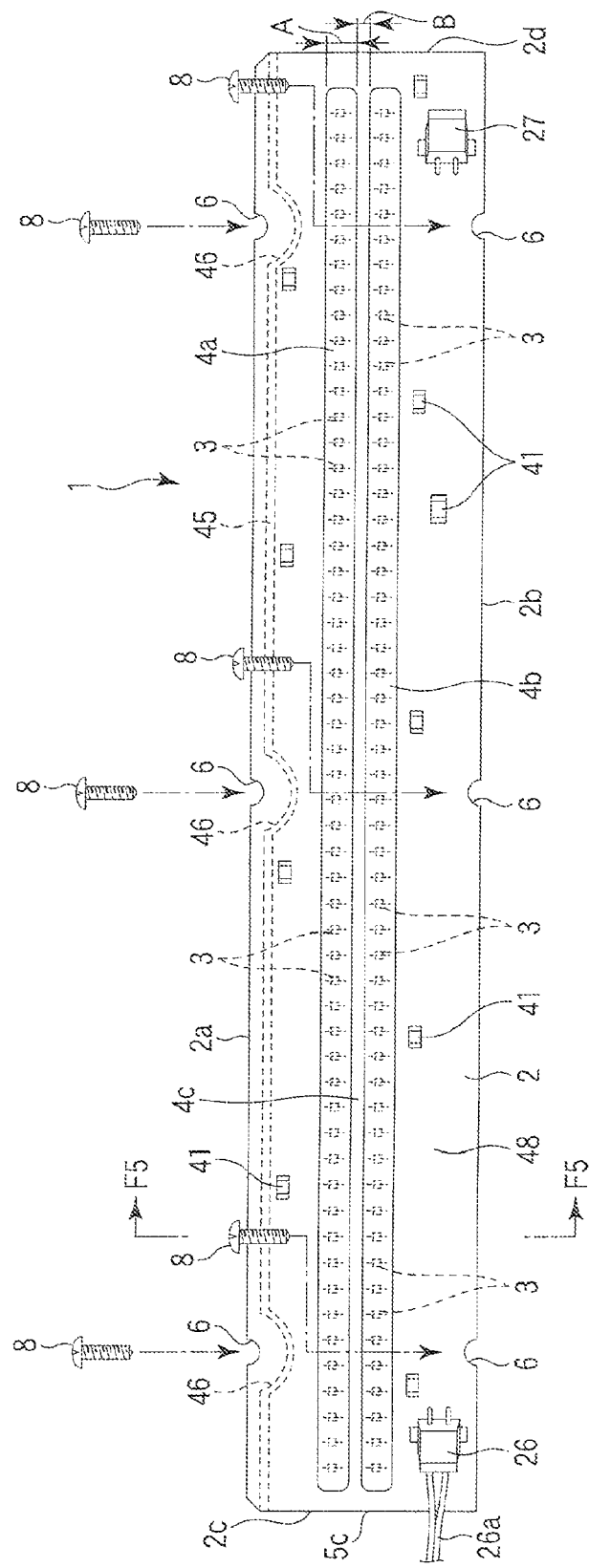
F I G. 1

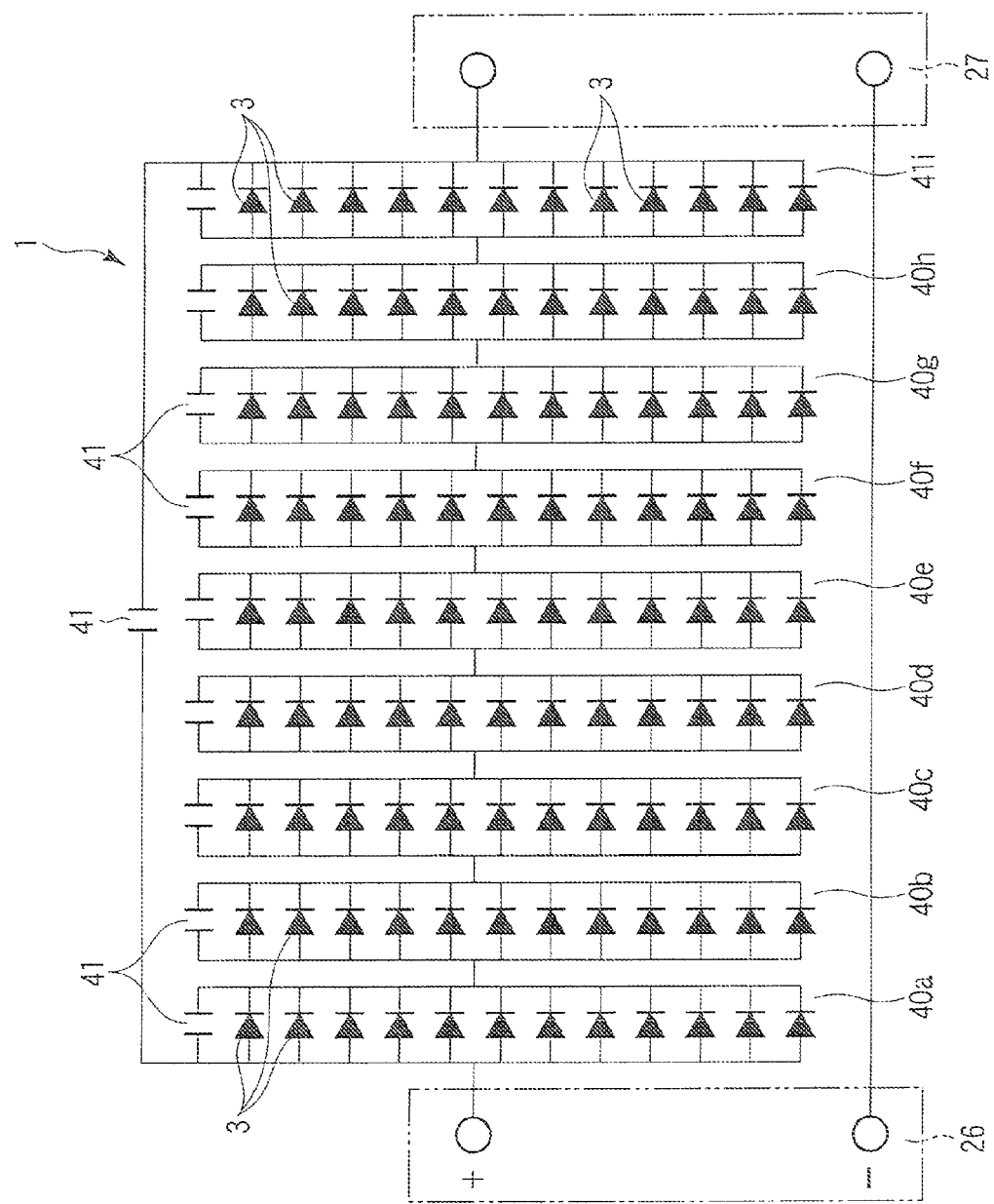
F I G. 6

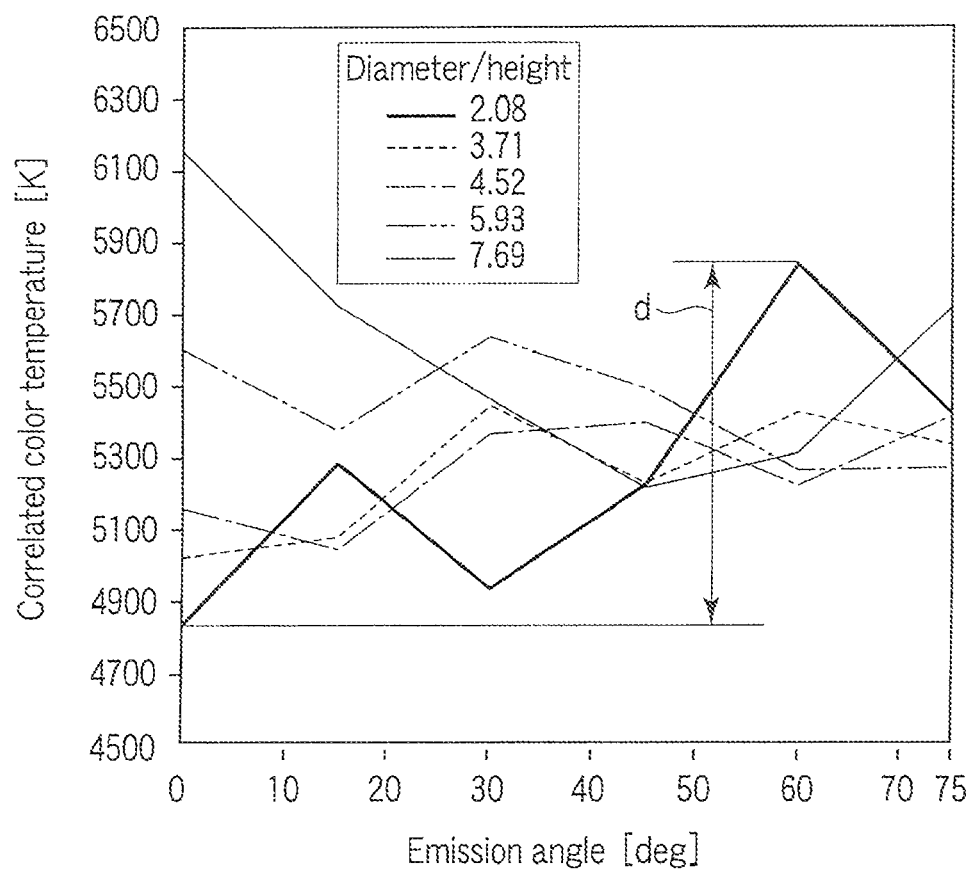
F I G. 10

LIGHT-EMITTING DEVICE AND ILLUMINATION DEVICE

CROSS-REFERENCE TO RELATED APPLICATIONS

This application is based upon and claims the benefit of priority from Japanese Patent Applications No. 2010-029544, filed Feb. 12, 2010; and No. 2011-016408, filed Jan. 28, 2011; the entire contents of both of which are incorporated herein by reference.

FIELD

Embodiments described herein relate generally to a light-emitting device and illumination device using a light-emitting element such as a light-emitting diode (LED) or the like.

BACKGROUND

In recent years, illumination devices using a plurality of light-emitting diodes as a light source have been put into practical use. The illumination devices of this type are used as, for example, so-called surface-mounted general lighting which is directly mounted on the indoor ceiling.

A light-emitting diode is mounted on a substrate, and is sealed with a sealing member. As the sealing member, for example, a material obtained by mixing a fluorescent substance into a transparent silicon resin or the like is used.

In this case, for example, a plurality of light-emitting diodes are arranged and mounted on a surface of a substrate in a matrix-form, and the entire surface of the substrate is sealed with a sealing member. However, when the entire surface of the substrate is covered with the sealing member as described above, the amount of the used sealing member becomes large, and material cost becomes high correspondingly.

Accordingly, a method of arranging and mounting a plurality of light-emitting diodes on a surface of a substrate in a plurality of lines, and sealing the light-emitting diodes of each line with a long and thin sealing member is conceivable. By this method, it is possible to reduce the amount of the sealing member, and suppress the manufacturing cost of the illumination device correspondingly.

However, in this case, when the illumination device is turned, on, there is the possibility of a dark part being formed between the lines of the sealing member.

Thus, development of a light-emitting device and illumination device in which no luminance unevenness is caused by such a dark part is demanded.

BRIEF DESCRIPTION OF THE DRAWINGS

FIG. 1 is a schematic view of a light-emitting device according to a first embodiment viewed from the top surface side.

FIG. 6 is a connection diagram showing a connection state of the plurality of light-emitting diodes.

FIG. 10 is a graph showing relationships between an emission angle and correlated color temperature of the light-emitting device of FIG. 1.

DETAILED DESCRIPTION

In general, according to one embodiment, a light-emitting device 1 comprises a substrate 2 on which a plurality of light-emitting elements 3 are arranged and mounted in two lines; and sealing members 4a and 4b of two lines each sealing the plurality of light-emitting elements of each line. A distance B between the lines of the sealing members is 0.5 to 2 times a width A of the sealing member of each line.

Various embodiments will be described hereinafter with reference to the accompanying drawings.

First Embodiment

Figure 7:
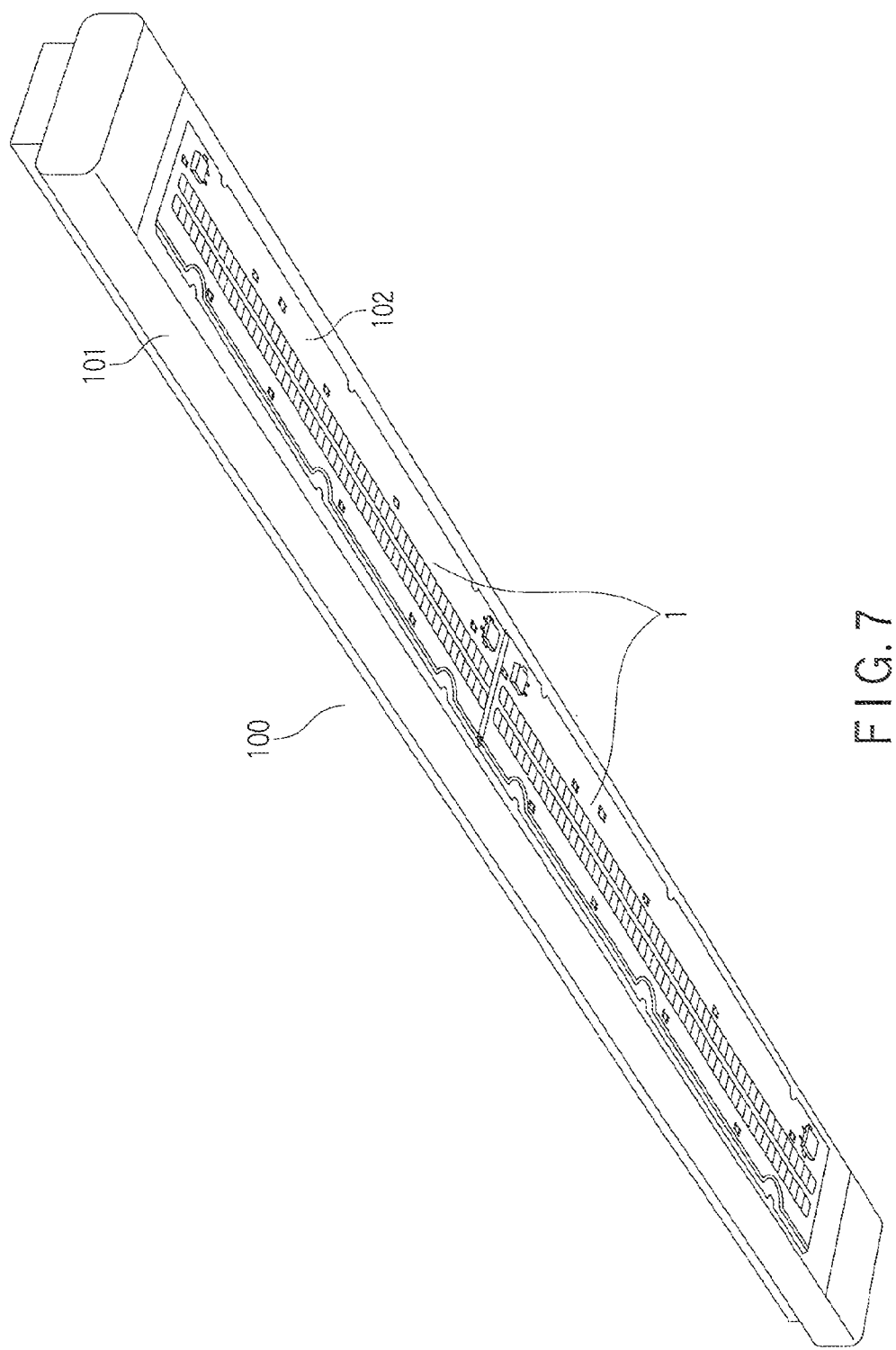
FIG. 7 is a perspective view of an illumination device in which the light-emitting device of FIG. 1 is incorporated.

Hereinafter, a first embodiment will be described below with reference to FIGS. 1 to 7. FIGS. 1 to 6 show a light-emitting device 1, and FIG. 7 shows an illumination device 100 using this light-emitting device 1. It should be noted that in each drawing, the same parts are denoted by the same reference symbols, and a duplicate description is omitted.

The light-emitting device 1 serving as an illumination light source comprises a substrate 2, a plurality of light-emitting elements 3, and a pair of sealing members 4a and 4b. The substrate 2 is formed of a synthetic resin material such as a glass epoxy resin. The substrate 2 is formed into a long and thin shape having a pair of long sides 2a and 2b, and a pair of short sides 2c and 2d. Furthermore, the substrate 2 has a first surface 5a, second surface 5b positioned on the opposite side of the first surface 5a, and outer peripheral surface 5c connecting the first surface 5a and second surface 5b to each other. Both the first and second surfaces 5a and 5b are flat surfaces. According to this embodiment, a length of the substrate 2 along the long side 2a or 2b is 230 mm, and width thereof along the short side 2c or 2d is 35 mm. Furthermore, it is desirable that a thickness of the substrate 2 be 0.5 mm to 1.8 mm. In this embodiment, a substrate 2 having a thickness dimension of 1.0 mm is used.

The shape of the substrate 2 is not limited to the rectangular shape, and may be a square or circular shape. Further, as the material for the substrate 2, ceramics material or other synthetic resin materials can be used. Furthermore, in order to enhance the heat radiation performance of each light-emitting element 3, a metallic substrate in which an insulating layer is formed on one surface of a base plate made of aluminum or the like, having high thermal conductivity, and excellent in heat radiation may be used as the substrate 2.

A plurality of piercing parts 6 are formed at end edges defining the long sides 2a and 2b of the substrate 2. The piercing parts 6 are arcuate cutout parts opened to the outer peripheral surface 5c of the substrate 2, and pierce through the substrate 2 in a thickness direction. Furthermore, the piercing parts 6 are arranged at intervals in the longitudinal direction of the substrate 2.

A plurality of screws 8 are inserted through the respective piercing parts 6. The screws 8 are an example of fixing parts configured to fix the substrate 2 to a base of the illumination device, and are screwed into the base through the piercing parts 6. In a state where the screws 8 are screwed into the base, the end edge of the substrate 2 is held between head parts of the screws 8 and the base. Hereby, the substrate 2 is fixed to the base.

Figure 2:
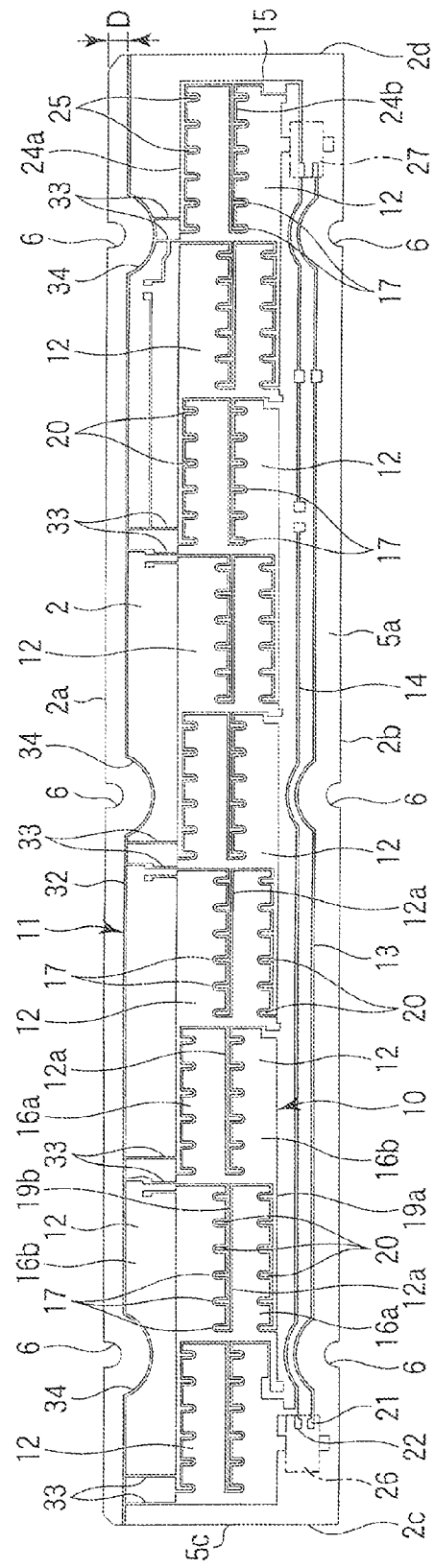
FIG. 2 is a schematic view showing a conductor pattern on a substrate of the light-emitting device of FIG. 1.

As shown in FIG. 2, a first conductor pattern 10 and second conductor pattern 11 are formed on the first surface 5a of the substrate 2. The first conductor pattern 10 includes, for example, nine pads 12, positive power supply conductor 13, negative power supply conductor 14, and relay conductor 15. The pads 12 have a rectangular shape, and are arranged in line at intervals in the longitudinal direction of the substrate 2.

Each pad 12 is divided into a first mounting area 16a and second mounting area 16b by a slit 12a. The slit 12a linearly extends in a central part of the pad 12 in the longitudinal direction of the substrate and is opened to one end of the pad 12. Six depressed parts 17 are formed in the first mounting area 16a of each pad 12. The depressed parts 17 are opened to one side edge of the pad 12, and are arranged in line at intervals in the longitudinal direction of the substrate 2. Likewise, six depressed parts 17 are formed in the second mounting area 16b of each pad 12. The depressed parts 17 are opened to the slit 12a, and are arranged in line at intervals in, the longitudinal direction of the substrate 2.

As shown in FIG. 2, each of the pads 12 other than one pad 12 positioned at the left end of the substrate 2 has a pair of extension parts 19a and 19b. The extension parts 19a and 19b linearly extend from one end of the pad 12 in the longitudinal direction of the substrate 2, and are arranged in parallel with each other with an interval held between them. Each of the extension parts 19a and 19b has six power supply terminals 20. The power supply terminals 20 are projected from the extension parts 19a and 19b, and are arranged in line at intervals in the longitudinal direction of the substrate 2.

One extension part 19a of each pad 12 extends along one side edge of the adjacent pad 12. The power supply terminals 20 of the extension part 19a are inserted into the respective depressed parts 17 opened to one side edge of the pad 12. The extension part 19a and the side edge of the pad 12 are electrically separated from each other by providing an insulating space between them. Likewise, the power supply terminals 20 of the extension part 19a and depressed parts 17 are electrically separated from each other by providing insulating spaces between them.

The other extension part 19b of each pad 12 is inserted into the slit 12a of the adjacent pad 12. The power supply terminals 20 of the extension part 19b are inserted into the respective depressed parts 17 opened to the slit 12a. The extension part 19b and pad 12 are electrically separated from each other by an insulating space positioned inside the slit 12a. Likewise, the power supply terminals 20 of the extension part 19b and depressed parts 17 are electrically separated from each other by providing insulating spaces between them.

Therefore, as is clear from FIG. 2, the plurality of pads 12 are arranged in line in the longitudinal direction of the substrate 2, in a state where the extension parts 19a and 19b are alternately reversed in the width direction of the substrate 2.

As shown in FIG. 2, the positive power supply conductor 13 extends over the whole length of the substrate 2 to run along the long side 2b of the substrate 2. The negative power supply conductor 14 extends in the longitudinal direction of the substrate 2 to run along the long side 2b of the substrate 2. The left end of the negative power supply conductor 14 is connected to the pad 12 positioned at the left end of the substrate 2.

The positive power supply conductor 13 has a positive electrode terminal 21. Likewise, the negative power supply conductor 14 has a negative electrode terminal 22. The positive electrode terminal 21 and negative electrode terminal 22 are arranged side by side with an interval held between them at the left end part of the substrate 2.

The relay conductor 15 extends in the longitudinal direction of the substrate 2 to run along the long side 2b of the substrate 2. The relay conductor 15 is positioned at a right end part of the substrate 2. The relay conductor 15 includes a pair of power supply patterns 24a and 24b. The power supply patterns 24a and 24b linearly extend in the longitudinal direction of the substrate 2, and are arranged in parallel with each other with an interval held between them. Each of the power supply patterns 24a and 24b has six power supply terminals 25. The power supply terminals 25 are projected from the power supply patterns 24a and 24b, and are arranged in line at intervals in the longitudinal direction of the substrate 2.

One power supply pattern 24a extends along one side edge of the pad 12 positioned: at the right end of the substrate 2. The power supply terminals 25 of the power supply pattern 24a are inserted into the respective depressed parts 17 opened to the side edge of the pad 12. The power supply pattern 24a and side edge of the pad 12 are electrically separated from each other by providing an insulating space between them. Likewise, the power supply terminals 25 of the power supply pattern 24a and the depressed parts 17 of the pad 12 are electrically separated from each other by providing insulating spaces between them.

The other power supply pattern 24b is inserted into the slit 12a of the pad 12 positioned at the right end of the substrate 2. The power supply terminals 25 of the power supply pattern 24b are inserted into the respective depressed parts 17 opened to the slit 12a. The power supply pattern 24b and pad 12 are electrically separated from each other by an insulating space positioned inside the slit 12a. Likewise, the power supply terminals 25 of the power supply pattern 24b and the depressed parts 17 of the pad 12 are electrically separated from each other by providing insulating spaces between them.

As shown in FIG. 1 and FIG. 2, a power supply connector 26 is soldered, to the positive electrode terminal 21 and negative electrode terminal 22. The power supply connector 26 is positioned on the first surface 5a of the substrate 2, and is electrically connected to a power supply circuit through lead wires 26a. Furthermore, the negative power supply conductor 14 and relay conductor 15 are short-circuited through a relay connector 27.

Figure 5:
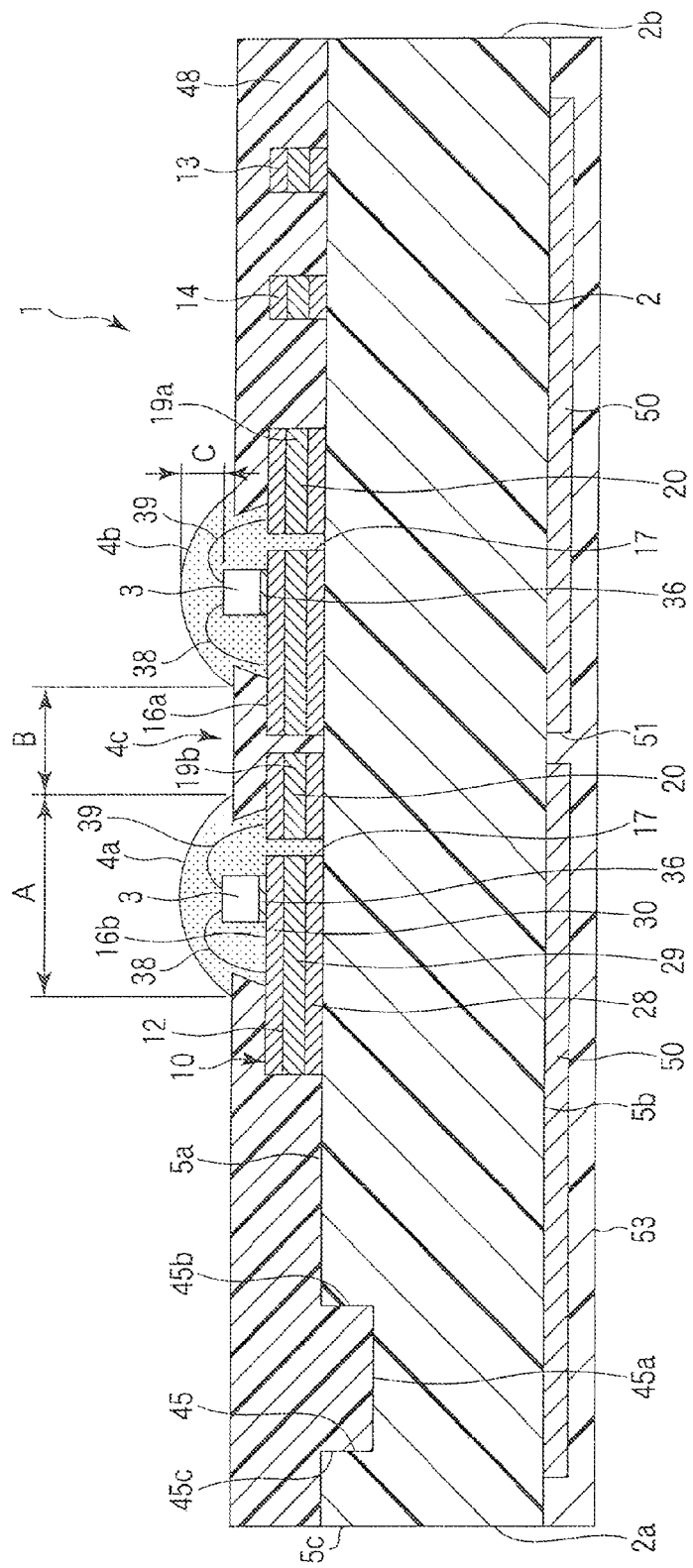
FIG. 5 is a cross-sectional view taken along line F5-F5 of FIG. 1.

As shown in FIG. 5, the first conductor pattern 10 including the pads 12 has a three-layer structure including a copper layer 28, nickel-plated layer 29, and silver-plated layer 30. The copper layer 28 is formed by etching a copper foil layer formed on the first surface 5a of the substrate 2. The nickel-plated layer 29 is formed on the copper layer 28 by subjecting the copper layer 28 to electrolytic plating. The silver-plated layer 30 is formed on the nickel-plated layer 29 by subjecting the nickel-plated layer 29 to electrolytic plating. The silver-plated layer 30 covers the nickel-plated layer 29, and constitutes a reflecting layer exposed on the surface of the first conductor pattern 10. Therefore, the surface of the first conductor pattern 10 is a light-reflecting surface. The total reflectivity of this light-reflecting surface is about 90%.

It is desirable that the nickel-plated layer 29 should have a film thickness of 5 μm or more. Likewise, it is desirable that the silver-plated layer 30 should have a film thickness of 1 μm or more. By specifying the film thicknesses of the nickel-plated layer 29 and silver-plated layer 30 in such a manner, it is possible to eliminate variations in thickness of the nickel-plated layer 29 and silver-plated layer 30, and make the optical reflectivity of all the pads 12 uniform.

The second conductor pattern 11 is used for maintaining all the pads 12 at the same potential when the pads 12 of the first conductor pattern 10 are subjected to electrolytic plating. More specifically, the second conductor pattern 11 includes a common line 32 and a plurality of branch lines 33 as shown in FIG. 2. The common line 32 linearly extends over the whole length of the substrate 2 to run along the long side 2a of the substrate 2. At the same time, the common line 32 is separate from the end edge of the substrate 2 by a predetermined distance D, the end edge defining the long side 2a of the substrate 2.

Furthermore, the common line 32 has a plurality of curved parts 34 at positions corresponding to the piercing parts 6 of the substrate 2. Each of the curved parts 34 is arcuately curved in a direction in which a distance from the edge of the piercing part 6 becomes larger. As a result of this, by presence of the curved parts 34, the common line 32 is separate from the edges of the piercing parts 6, by at least the same distance as the distance D at positions corresponding to the piercing parts 6.

The branch lines 33 are branched from the common line 32, and linearly extend toward the pads 12. The branch lines 33 are arranged at intervals in the longitudinal direction of the substrate 2. Distal ends of the branch lines 33 are electrically connected to all the pads 12 and power supply pattern 24a of the relay conductor 15. In other words, all the pads 12 and relay conductor 15 are electrically connected to the common line 32 through the branch lines 33.

The second conductor pattern 11 is formed on the first surface 5a of the substrate 2 simultaneously with the first conductor pattern 10, and has the same three-layer structure as that of the first conductor pattern 10. Therefore, the surface of the second conductor pattern 11 is formed of a silver-plated layer, and has light reflectivity.

Each of the plurality of light-emitting elements 3 is constituted of a paired chip of light-emitting diodes (LEDs). In this embodiment, white light is emitted through the light-emitting device 1, and hence light-emitting elements 3 configured to emit blue light are used. The LED paired chip 3 is, for example, an InGaN-based element, in which light-emitting layers are formed on a translucent sapphire element board. The light-emitting layers are formed by depositing an n-type nitride semiconductor layer, InGaN light-emitting layer, and p-type nitride semiconductor layer one on top of another. Further, electrodes configured to cause a current to flow through the light-emitting layers are constituted of a positive electrode formed of a p-type electrode pad on the p-type nitride semiconductor layer, and negative electrode formed of an n-type electrode pad on the n-type nitride semiconductor layer.

The light-emitting elements 3 are individually attached to the first mounting area 16a and second mounting area 16b of each pad 12 through a silicon resin adhesive 36. More specifically, six light-emitting elements 3 are arranged in the first mounting area 16a of each pad 12 in line at intervals in the longitudinal direction of the substrate 2, and six light-emitting elements 3 are arranged in the second mounting area 16b of each pad 12 in line at intervals in the longitudinal direction of the substrate 2. Accordingly, each pad 12 includes twelve light-emitting elements 3.

That is, when nine pads 12 are arranged in the longitudinal direction of the substrate 2, each line of fifty-four light-emitting elements 3 is arranged in the longitudinal direction of the substrate. In this manner, the light-emitting elements 3 of each of the two lines arranged in the longitudinal direction of the substrate 2 are sealed with a long and thin sealing member 4a or 4b as shown in FIG. 1. In this embodiment, although two lines of light-emitting elements 3 are arranged in the longitudinal direction of the substrate 2, the lines of the light-emitting elements 3 may be three lines or more.

Figure 3:
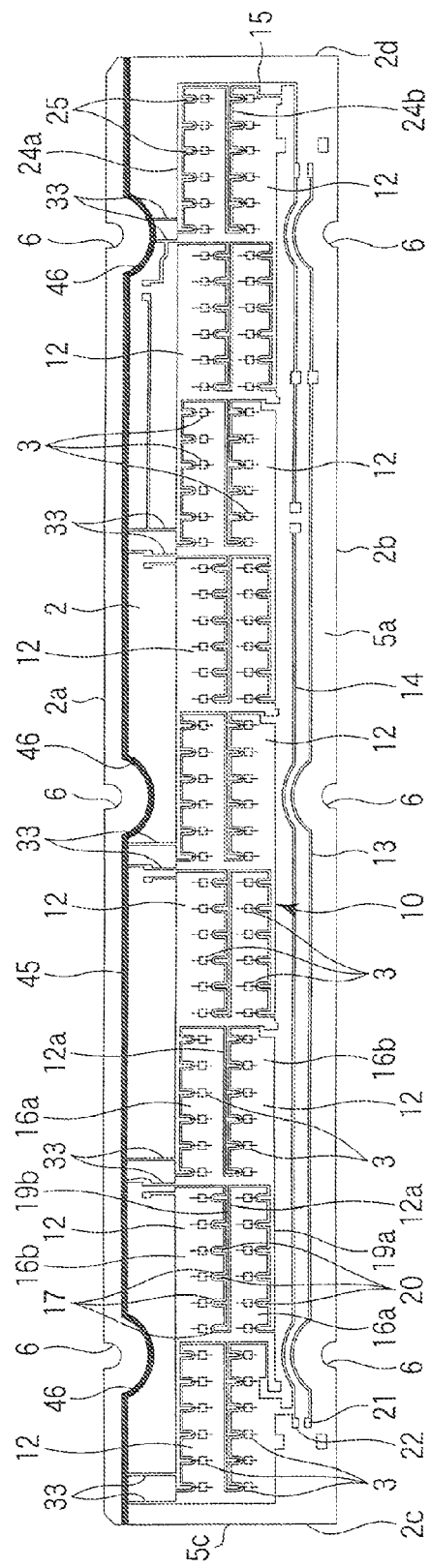
FIG. 3 is a Schematic view showing a state where a second conductor pattern is removed from the substrate of FIG. 2, and a plurality of light-emitting diodes are mounted thereon.

As shown in FIG. 3 and FIG. 5, the positive electrode of each light-emitting element 3 is electrically connected to the pad 12 to which the light-emitting element 3 is affixed, through a bonding wire 38. The negative electrode of each light-emitting element 3 is electrically connected to each of the power supply terminals 20 of the adjacent pad 12 and each of power supply terminals 25 of the power supply patterns 24a and 24b by another bonding wire 39. These bonding wires 38 and 39 are constituted of a gold (Au) thin wire and, for the purpose of improving the mounting strength, and reducing the damage of the LED paired chip, are connected through bumps a chief ingredient of which is gold (Au).

Specifically, as shown in FIG. 6, the light-emitting device 1 has nine parallel circuits 40a, 40b, 40c, 40d, 40e, 40f, 40g, 40h, and 40i, in each of which twelve light-emitting elements 3 are connected in parallel. Furthermore, the nine parallel circuits 40a, 40b, 40c, 40d, 40e, 40f, 40g, 40h, and 40i are connected in series.

Moreover, in this embodiment, in order to prevent a malfunction of the light-emitting device 1, a capacitor 41 is connected to each of the nine parallel circuits 40a, 40b, 40c, 40d, 40e, 40f, 40g, 40h, and 40i. At the same time, a capacitor 41 is also connected to a circuit configured to connect the parallel circuits 40a, 40b, 40c, 40d, 40e, 40f, 40g, 40h, and 40i in series. The capacitors 41 are mounted on the first surface 5a of the substrate 2.

In this embodiment, the power supply terminals 20 and 25 to which the bonding wires 39 are connected are inserted into the depressed parts 17 of the adjacent pad 12. In other words, the power supply terminals 20 and 25 advance toward the central parts of the first and the second mounting areas 16a and 16b, and hence the light-emitting elements 3 can be affixed to the central parts of the first and the second mounting areas 16a and 16b, without changing the lengths of the bonding wires 38 and 39. Therefore, it is possible to conduct the heat generated by the light-emitting elements 3 to a wide range of the first and the second mounting areas 16a and 16b, and efficiently radiate the heat from the pads 12.

The second conductor pattern 11 configured to maintain all the pads 12 at the same potential becomes useless after the first conductor pattern 10 is subjected to electrolytic plating. Therefore, in this embodiment, after the first conductor pattern 10 is subjected to electrolytic plating, the common line 32 of the second conductor pattern 11 is removed to thereby sever electrical connection between the pads 12 obtained by the second conductor pattern 11.

As shown in FIG. 3, and FIG. 5, a depressed part 45 is formed in the first surface 5a of the substrate 2. The depressed part 45 is traces which are left after the common line 32 is removed, and extends along the long side 2a of the substrate 2. The depressed part 45 is a groove which is defined by a bottom surface 45a and a pair of side surfaces 45b and 45c, and is opened to the first surface 5a of the substrate 2.

Furthermore, the depressed part 45 has a plurality of curved parts 46 at positions corresponding to the piercing parts 6 of the substrate 2. The curved parts 46 are formed into a shape coinciding with the shape of the curved parts 34 of the common line 32 in such a manner that the parts 46 detour around the piercing parts 6. The depressed part 45 having the above structure is positioned between the end edge of the substrate 2, which defines the long side 2a of the substrate 2, and the pads 12, and is separate from the end edge of the substrate 2 by a predetermined distance. According to this embodiment, the depressed part 45 has a width dimension of 1 mm, and depth dimension of 0.3 mm.

By presence of the depressed part 45 as described above, only the branch lines 33 of the second conductor pattern 11 remain on the first surface 5a of the substrate 2. The remaining branch lines 33 are electrically separated from each other. Furthermore, a creepage distance from the end edge of the substrate 2 which defines the long side 2a of the substrate 2 to the pads 12 is a value obtained by adding the height dimensions of the side surfaces 45b and 45c of the depressed part 45 to the original distance. Therefore, the creepage distance becomes longer than the clearance (spatial distance) from the end edge of the substrate 2 to the pads 12 by a dimension corresponding to the depth of the depressed part 45. The shape of the depressed part 45 is not limited to that of this embodiment. For example, the depressed part 45 may have a V-shaped or U-shaped cross section in the direction perpendicular to the longitudinal direction of the substrate 2.

The sealing members 4a and 4b seal the light-emitting elements 3 which are arranged in two lines, and bonding wires 38 and 39 on the pads 12. The sealing members 4a and 4b are made of a transparent silicon resin in which an adequate amount of a fluorescent substance such as YAG, Ce or the like is mixed, are formed by coating in such a manner that their cross-sectional shape becomes a flat mountain shape, and linearly extend in the longitudinal direction of the substrate 2. A desirable cross-sectional shape of the sealing members 4a and 4b will be described later in detail.

The fluorescent substance is excited by light emitted from the light-emitting element 3, and radiates light of a color different from the color of the light emitted from the light-emitting element 3. In this embodiment, the light-emitting element 3 emits blue light, and hence a yellow fluorescent substance configured to radiate light of the yellow color in a complementary chromatic relationship to the blue color of the light is used as the fluorescent substance so that the light-emitting device 1 can emit light of the white color.

As shown in FIG. 1 and FIG. 5, the first surface 5a of the substrate 2 is covered with a white resist layer 48, except for areas on which parts such as the light-emitting elements 3 and capacitors 41 are mounted. At least a part to which a light-emitting element 3 (LED paired chip) is affixed, i.e., a mounting part of the light-emitting element 3 corresponds to the area in which no resist layer 48 is formed. The area is buried by the sealing member 4a or 4b to be sealed as shown in FIG. 1 and FIG. 5.

The resist layer 48 has light reflectivity. The resist layer 48 continuously covers the first conductor pattern 10, branch lines 33, and depressed part 45 except the above-mentioned areas. Therefore, the first conductor pattern 10, branch lines 33, and depressed part 45 on the first surface 5a of the substrate 2 are not easily viewed.

As shown in FIG. 5, the pads 12 are formed on the first surface 5a of the substrate 2, and the resist layer 48 is formed on the pads 12. The resist layer 48 is formed of a white photoresist material. Further, the resist layer 48 bears a function of reflecting light emitted from the light-emitting element 3 in the frontward direction (upward: direction in FIG. 5), and function of preventing the metallic layers such as the pads 12, power supply conductors 13 and 14, and the like from being corroded. In order to reflect the light emitted from the light-emitting element 3 from the surface of the resist layer 48, it is necessary to make the top surface of the light-emitting element 3 higher than at least the surface of the resist layer 48. In other words, it is desirable that the surface of the resist layer 48 be formed at a position lower than the top surface of the light-emitting element 3.

Accordingly, in this embodiment, the thickness of each pad 12 is set at 35 μm, thickness of the resist layer 48 is set at 40 μm, and height of the light-emitting element 3 is set at 80 μm. It is desirable that the thickness of the resist layer 48 be set at a value from 30 to 40 μm and, for example, when the thickness of the resist layer 48 is to be changed to 30 μm, it is sufficient if the thickness of the pad 12 is made less than 30 μm.

Figure 4:
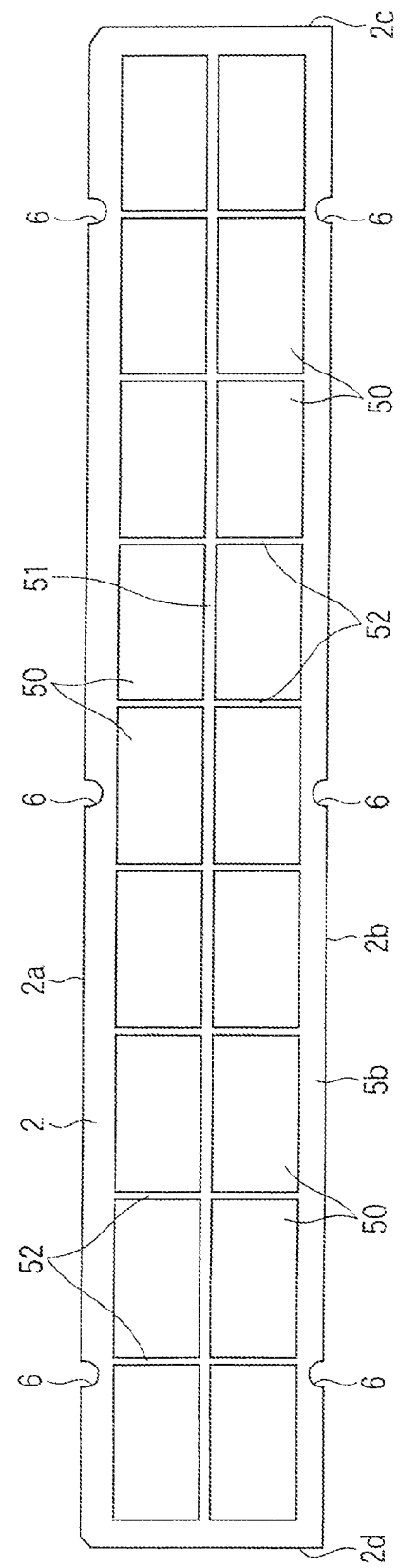
FIG. 4 is a schematic view of the substrate of FIG. 2 viewed from the back surface side.

As shown in FIG. 4 and FIG. 5, eighteen rectangular heat-radiation sheets 50 are formed on the second surface 5b of the substrate 2. The heat-radiation sheets 50 are an example of conductors, and are formed of copper foil excellent in thermal conductivity. The heat-radiation sheets 50 are arranged in two lines at intervals in the longitudinal direction of the substrate 2 such a manner that the sheets 50 correspond to the pads 12 on the first surface 5a. Heat-radiation sheets 50 adjacent to each other are thermally separated from each other by a first slit 51 extending in the longitudinal direction of the substrate 2, and a plurality of second slits 52 each extending in a lateral direction perpendicular to the longitudinal direction of the substrate 2. Furthermore, the heat-radiation sheets 50 and second surface 5b of the substrate 2 are covered with a resist layer 53.

By forming the heat-radiation sheets 50 on the second surface 5b of the substrate 2, it is possible to uniformize temperature distribution of the substrate 2 which receives the heat of the light-emitting elements 3. Therefore, the thermal radiation performance of the substrate 2 can be enhanced. In particular, by providing the second slits 52 extending in the direction perpendicular to the longitudinal direction of the substrate 2 between the heat-radiation sheets 50 adjacent to each other, it is possible to suppress a warp and deformation of the substrate 2 caused by heat.

Next, a process of manufacturing the light-emitting device 1 will be described below with reference to FIGS. 1 to 3, and FIG. 5. It should be noted that here, a description of a process of forming the heat-radiation sheets 50 on the second surface 5b of the substrate 2 is omitted.

First, the first conductor pattern 10 and second conductor pattern 11 are formed on the first surface 5a of the substrate 2. More specifically, the copper foil deposited on the first surface 5a is etched, whereby copper layers 28 of the first and second conductor patterns 10 and 11 are formed. In the copper layer 28 of the first conductor pattern 10, parts constituting the pads 12 are electrically connected to each other through the copper layer 28 of the second conductor pattern 11. Therefore, all the parts of the copper layer 28 of the first conductor pattern 10 each constituting the pads 12 are maintained at the same potential.

In this state, the copper layer 28 of the first conductor pattern 10 is subjected to electrolytic plating, whereby a nickel-plated layer 29 is formed on the copper layer 28. Subsequently, the nickel-plated layer 29 is subjected to electrolytic plating, whereby a silver-plated layer 30 is formed on the nickel-plated layer 29. In the step of performing electrolytic plating, all the parts in the copper layer 28 of the first conductor pattern 10 each constituting the pads 12 are maintained at the same potential. Therefore, the nickel-plated layer 29 and silver-plated layer 30 are formed on the copper layer 28 of the first conductor pattern 10 by using the copper layer 28 of the first conductor pattern 10 as a negative electrode, using a metal identical with the metal of the layer to be formed by plating as a positive electrode, and causing an electric current to flow between both the electrodes. The nickel-plated layer 29 and silver-plated layer 30 are also formed on the copper layer 28 of the second conductor pattern 11 simultaneously with the first conductor pattern 10. This state is shown in FIG. 2.

Thereafter, as shown in FIG. 3, the common line 32 of the second conductor pattern 11 is removed from the first surface 5a of the substrate 2. More specifically, the common line 32 on the first surface 5a is scraped away. As a result, electrical connection between the pads 12 of the first conductor pattern 10 and second conductor pattern 11 is severed, and the pads 12 are maintained in a state where the pads 12 are electrically independent.

When the common line 32 is scraped, away from the first surface 5a, a groove-like depressed part 45 is formed in the first surface 5a. The depressed part 45 has the curved parts 46 which are curved to detour around the piercing parts 6, at positions corresponding to the piercing parts 6 of the substrate 2.

The depressed part 45 intersects the bases of the branch lines 33 branching off from the common line 32. As a result, the branch lines 33 are left on the first surface 5a of the substrate 2 in a state where the branch lines 33 are electrically separated from each other.

Thereafter, as shown in FIG. 3, six light-emitting elements 3 are affixed to each of the first and second mounting areas 16a and 16b of each pad 12. Then, the positive electrodes of the light-emitting elements 3 are electrically connected to the pads 12 to which the light-emitting elements 3 are affixed by bonding wires 38. Likewise, the negative electrodes of the light-emitting elements 3 are connected to the power supply terminals 20 of the adjacent pads 12, and power supply terminals 25 of the power supply patterns 24a and 24b by bonding wires 39.

Furthermore, thereafter, as shown in FIG. 1 and FIG. 5, a pattern of the resist layer 48 is formed on the conductor patterns 10 and 11. As described previously, the pattern of the resist layer 48 is formed on the substrate surface except the mounting areas of the light-emitting elements 3, and mounting positions of the other electronic components. In this embodiment, the resist layer 48 is formed by using a white photoresist material. Accordingly, the resist layer 48 is irradiated with ultraviolet rays to carry out exposure and development, whereby the pattern of the area is formed.

The process of forming the pattern of the resist layer 48 can also be carried out before the removal process of the above-mentioned second conductor pattern 11. In this embodiment, the resist layer 48 is formed after the second conductor pattern 11 is removed, and hence the depressed part 45 appearing after the second conductor pattern 11 is scraped away is filled with the resist layer 48 as shown in FIG. 1 and FIG. 5. However, by scraping away the second conductor pattern 11 together with the resist layer 48 after the resist layer 48 is formed, the depressed part 45 is exposed on the surface of the light-emitting device 1.

Finally, the light-emitting elements 3 arranged in two lines and the bonding wires 38 and 39 are sealed on the pads 12 by using the sealing members 4a and 4b. Hereby, the light-emitting device 1 as shown in FIG. 1 and FIG. 5 is formed.

At this time, the sealing members 4a and 4b are applied to the light-emitting elements 3 of each row and bonding wires 38 and 39 in a form of a straight line as shown in FIG. 1 in an uncured state where the members 4a and 4b are adjusted to appropriate viscosity in such a manner that the members 4a and 4b do not flow out thoughtlessly, and maintain a flat mountain shape a cross section of which is shown in FIG. 5. Further, after the sealing members 4a and 4b are heated to be cured, or after the sealing members 4a and 4b are left as they are for a predetermined time, the sealing members 4a and 4b are cured and fixed, to the above-mentioned areas of the resist layer 48.

Next, the illumination device 100 in which the above-mentioned light-emitting device 1 is incorporated will be described below with reference to FIG. 7. Here, the illumination device 100 to be described is, for example, an illumination device of the ceiling mounting type which is mounted on the ceiling of a room to be used.

The illumination device 100 is provided with a main body case, 101 having substantially a long and thin parallelepiped-shape. In this main body case 101, a plurality of (two in this embodiment) light-emitting devices 1 described above are connected and arranged side by side in the longitudinal direction. Further, a power supply unit (not shown) provided with a power supply circuit (not shown) is incorporated in the main body case 101. It should be noted that a front cover 102 having light-diffusing properties is attached to a lower opening part of the main body case 101.

When the two light-emitting devices 1 are energized by the power supply circuit, a plurality of light-emitting elements 3 are turned on all at once, and light is emitted from each of the plurality of light-emitting elements 3. The light emitted from each of the plurality of light-emitting elements 3 passes through a sealing member 4a or 4b, and front cover 102 in sequence, and is utilized as white illumination light. That is, the illumination device 100 is used as a surface light source.

While the illumination device 100 is lighting, the pads 12 function as a heat spreader configured to spread heat generated from the light-emitting elements 3. Further, while the light-emitting devices 1 are emitting light, part of the light emitted from the light-emitting elements 3, the part of the light being directed toward the substrate 2 side, is reflected from the reflecting layer on the surface side of the pads 12 mostly in the light-utilization direction. Accordingly, it is possible to make the light-extraction efficiency excellent.

Further, at this time, each of the sealing members 4a and 4b sealing the plurality of light-emitting elements 3 bears a function of diffusing light emitted from each light-emitting element 3. Furthermore, the front cover 102 bears a function of further diffusing light passing therethrough. That is, by providing the sealing members 4a and 4b, and front cover 102, luminance unevenness peculiar to a light-emitting device 1 using a point light source is suppressed.

However, when the structure in which lines of light-emitting diodes are sealed with long and thin sealing members 4a and 4b as in the case of this embodiment is employed, luminance unevenness is liable to be caused in the illumination light from the illumination device 100 by the characteristics of the luminance and directivity of the light-emitting diode. That is, like in this embodiment, when long and thin sealing members 4a and 4b of the divided two lines are provided as shown in FIG. 1 and FIG. 5 in order to reduce the applied amount of the sealing members, a dark part is liable to be caused at a separation part 4c between the lines of the sealing members. In this case, stripe-like luminance unevenness due to the linear dark part is liable to be caused, and the appearance as an illumination device 100 is made poor.

As a method of eliminating such luminance unevenness, a method of increasing the lines of the light-emitting elements to three lines to narrow the space between the sealing members is conceivable. However, when this method is employed, the number of necessary light-emitting elements 3 becomes larger, and power consumption also becomes larger. When, instead of the above, the space B between the two lines of the light-emitting elements 3 is narrowed in order that the dark part may become inconspicuous, the width of the illumination light emitted from the illumination device 100 becomes narrower correspondingly, and the desired light distribution range cannot be obtained.

That is, in order to obtain illumination light having no stripe-like luminance unevenness, and having a wide light distribution range of sufficient satisfaction in a light-emitting device 1 provided with two lines of light-emitting elements 3 (sealing members 4a and 4b) like that of this embodiment, it is necessary to design the width A of the sealing member 4a or 4b of each line as an appropriate value, and design the space B between the sealing members 4a and 4b of the two lines as an appropriate value. That is, when it is premised that the width of the substrate 2 is predetermined, it is necessary to design the ratio between the width A of each of the sealing members 4a and 4b, and the space B between the members 4a and 4b as an appropriate value.

In order to investigate the appropriate ratio, the inventors of the present invention have variously changed the width A of each of the sealing members 4a and 4b of the two lines, and space B between them to observe the luminance unevenness and light distribution range of the illumination light. As a result, it was found that when the space B was made 0.5 to 2 times, or more desirably, 0.5 to 1 times the width A, illumination light of the desired light distribution range having no luminance unevenness could be obtained. For example, when the layout of the light-emitting elements 3 is predetermined due to the convenience of the design, i.e., when the space between the lines of the light-emitting elements 3 is predetermined, it is possible to set the above-mentioned ratio B/A at an appropriate value by controlling the width A of the sealing member 4a or 4b, and application position of the sealing member 4a or 4b.

Actually, at the separation part 4c between the two lines of the sealing members 4a and 4b, the surface of the resist layer 48 is exposed. The surface of the resist layer 48 reflects part of the light emitted from each of the light-emitting elements 3 in the lines on both sides toward the front side. The surface of the resist layer 48 has high reflectivity as described previously, and hence the light reflected from the separation part 4c partially bears a function of making the dark part inconspicuous. That is, the surface of the resist layer 48 at the separation part 4c functions as an intermediate member configured to suppress luminance unevenness.

Further, on the other hand, when the sealing members 4a and 4b each having a cross section of the flat mountain shape are used as described above, it is desirable that the problem of the angular color difference to be described below be also taken into consideration.

That is, the angular color differences of the light-emitting device are also influenced by the cross-sectional shape of each sealing member 4a or 4b. Accordingly, in the configuration of this embodiment, the sealing member 4a or 4b is formed into substantially a spherical shape with a diameter-to-height ratio of, for example, 2.0 to 7.8:1. According to this configuration, the angular color differences of the light-emitting device 1 can be reduced. The contents will be described below in detail with reference to FIGS. 8 to 10. It should be noted that a correlated color temperature difference is small implies that an angular color difference is small.

FIG. 10 shows relationships between the emission angle and correlated color temperature for some cases of different diameter-to-height ratios. It should be noted that the "diameter" mentioned herein implies the width A of each sealing member 4a or 4b. Further, the "height" mentioned herein implies the distance C (FIG. 5) from the light-emitting surface of the light-emitting element 3 to the surface of the top part of the sealing member 4a or 4b. In this embodiment, the light-emitting surface of the light-emitting element 3 is set slightly higher than the surface of the resist layer 48 or is set at a height substantially equal to the height of the surface of the resist layer 48, and hence it is considered that the "height" of the sealing member 4a or 4b corresponds to the protrusion height of the sealing member 4a or 4b from the surface of the resist layer 48.

That is, when the diameter-to-height ratio is 2.0, the cross-sectional shape of the sealing member 4a or 4b is hemispherical. As the diameter-to-height ratio increases, the cross-sectional shape of the sealing member 4a or 4b becomes more flat. The "emission angle" is the angle formed between the vertically downward direction set as the reference)(0°) and direction in which light is emitted.

Figure 8:
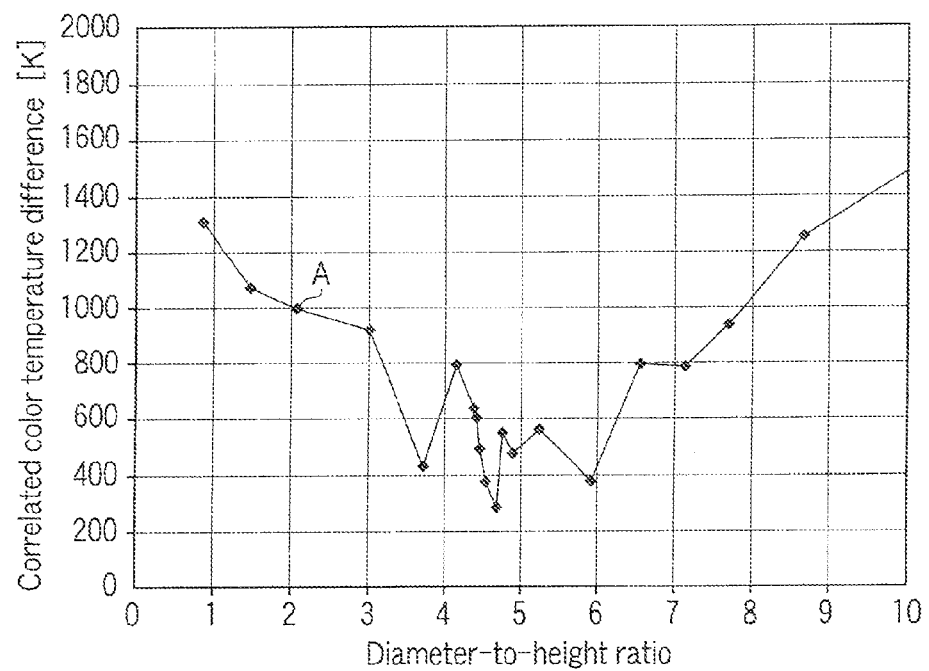
FIG. 8 is a graph showing a relationship between a diameter-to-height ratio of the sealing member and correlated color temperature difference of the light-emitting device of FIG. 1.

FIG. 8 shows the relationship between the diameter-to-height ratio and correlated color temperature difference. The "correlated color temperature difference" implies the difference between the maximum and minimum values of the correlated color temperature in an emission angle range from 0° to a predetermined angle (e.g., 75°). For example, a point A in FIG. 8 indicates that the correlated color temperature difference is about 1,000 K when the diameter-to-height ratio is about 2.08. This is obtained from the fact that a difference d between the maximum and minimum values on a graph line in FIG. 10 for the diameter-to-height ratio of 2.08 is about 1,000 K.

Most of the light that reaches the user is one that is emitted at an angle of 75° or less, and hence correlated color temperature differences for the emission angle range of 0° to 75° are important. Here, when the correlated color temperature difference exceeds 1,000 K, color unevenness begins to be relatively conspicuous. That is, it can be said that the maximum tolerable value of the correlated color temperature difference that does not discomfort the user is 1,000 K.

As shown in FIG. 8, in the range where the diameter-to-height ratio of each sealing member 4a or 4b is 2.0 to 7.8:1, the correlated color temperature difference can be confined to 1,000 K or less. Within this range, the angular color difference is too small to make the user conscious of.

Here, it is generally believed that the correlated color temperature for each emission angle depends on the length of an optical path from each light-emitting diode 3 to the surface of the sealing member 4a or 4b. In that case, when the cross-sectional shape of each sealing member 4a or 4b is hemispherical (i.e., when the diameter-to-height ratio is 2.0), optical path lengths at various points are equal to each other, and hence the angular color difference should be the smallest.

Nevertheless, the above result of analysis indicates that the angular color difference is the smallest when each sealing member 4a or 4b has a flat shape. In the range where the diameter-to-height ratio of the sealing member 4a or 4b is, for example, 4.4 to 6.2:1, the correlated color temperature difference is below 600 K, and hence the angular color difference can be made smaller.

Figure 9:
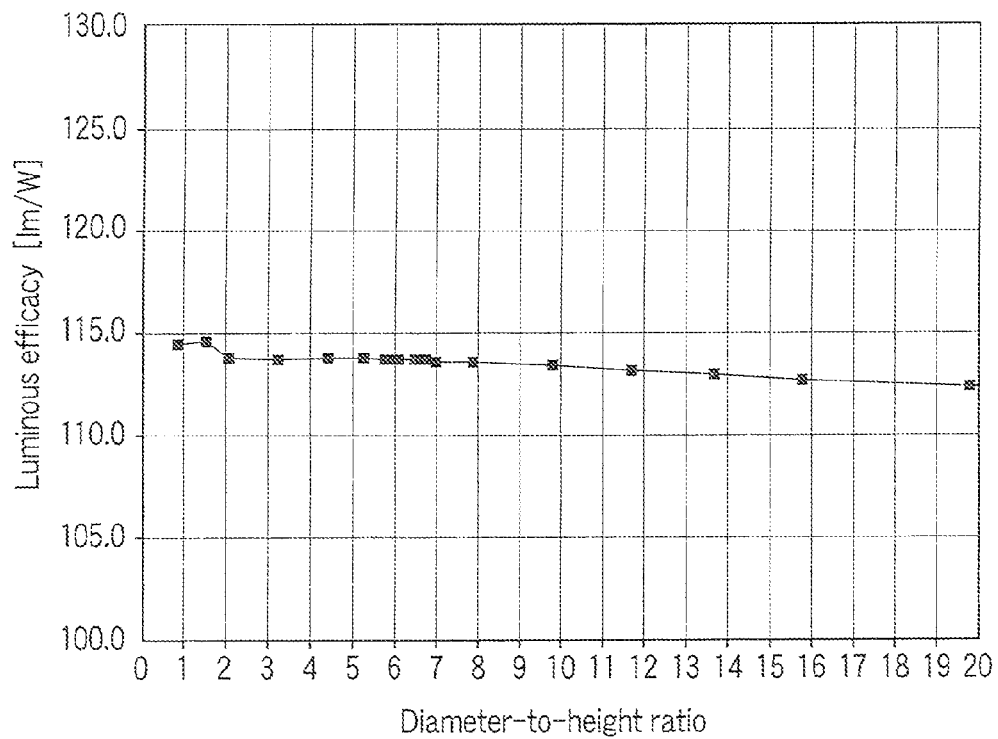
FIG. 9 is a graph showing a relationship between the diameter-to height ratio of the sealing member and luminous efficacy of the light-emitting device of FIG. 1.

It should be noted that experimental conditions for analyses of FIGS. 8 to 10 include a phosphor weight density of 10% and correlated color temperature of 5,000 K. It should be noted that when different phosphor densities are used in a state where the correlated color temperature is set constant, the shape of the sealing members 4*a* and 4*b* is similarly varied in size. Accordingly, even when the phosphor weight density varies, experimental conditions similar to the aforementioned ones can be obtained for the angular color difference. Further, it has been ascertained by the inventors of the present invention that experimental conditions similar to the aforementioned ones can also be obtained for all the so-called white color temperatures (e.g., 4,000 to 6,000 K). That is, enabling the angular color difference to be reduced by confining the diameter-to-height ratio of each sealing member 4*a* or 4*b* to 2.0 to 7.8:1 is not limited to the aforementioned experimental conditions.

It should be noted that FIG. 9 shows the relationship between the diameter-to-height ratio and luminous efficacy. As shown in FIG. 9, the luminous efficacy hardly varies even when the diameter-to-height ratio is greatly changed. That is, the luminous efficacy of the light-emitting device 1 is hardly reduced even when the shape of the sealing members 4*a* and 4*b* is changed in order to make the correlated color temperature difference smaller.

It should be noted that the range in which the diameter-to-height ratio of each sealing member 4*a* or 4*b* is 2.0 to 5.2:1 can be said to be desirable in consideration of the luminous efficacy, since the light-emitting device 1 can maintain higher (though slightly) luminous efficacy. Further, in consideration of robustness, the range in which the diameter-to-height ratio of each sealing member 4*a* or 4*b* is 5.2 to 7.8:1 is desirable. When the diameter and height are, for example, 4 and 0.675 mm, respectively, the diameter-to-height ratio is 5.93. In this case, even when the diameter and height change within the range of ±0.1 mm, the ratio varies only from 5.2.9 to 6.78, and the fluctuation is restricted to a small value.

Hereinafter, advantages of the above-mentioned first embodiment will be described.

The second conductor pattern 11 which maintains the pads 12 of the first conductor pattern 10 at the same potential is constituted of the common line 32 and the branch lines 33 that are branched off from the common line 32 and reach the pads 12. Therefore, electrical connection between the pads 12 obtained by the second conductor pattern 11 can be severed by removing the common line 32 from the substrate 2.

Therefore, it is possible to efficiently and easily carry out the work of cutting off electrical connection between the pads 12, and improve the productivity of the light-emitting device 1.

Moreover, the depressed part 45 which is left after the common line 32 is scraped away is separate from the end edge of the substrate 2 by the predetermined distance, and is positioned between the end edge of the substrate 2 and pads 12. As a result, the creepage distance between the end edge of the substrate 2 and pads 12 becomes longer than the clearance (spatial distance) between the end edge of the substrate 2 and pads 12 by a length corresponding to the depth of the depressed part 45, and it is possible to secure an insulation distance from the end edge of the substrate 2 to the pads 12.

In addition, the depressed part 45 has the curved parts 46 which are curved to detour around the piercing parts 6 at positions corresponding to the piercing parts 6 of the substrate 2. Therefore, it is possible to equally secure insulating distances from the edges of the piercing parts 6 to the curved parts 46, and improve the dielectric strength of the substrate 2. Thus, even when the screws 8 to be inserted through the piercing parts 6 are formed of metal, insulation between the screws 8 and pads 12 can be sufficiently secured, and the reliability of electrical insulation of the light-emitting device 1 can be improved.

In this embodiment, the surface of the resist layer 48 is formed at a position lower than the height of the top surface of the light-emitting element 3, and hence it is possible to reduce the degree to which the resist layer 48 is a hindrance to the light emitted from the light-emitting elements 3, and enhance the luminous efficacy.

Further, in this embodiment, the ratio B/A of the space B between the sealing members 4*a* and 4*b* to the width A of the sealing member 4*a* or 4*b* is made 0.5 to 2, or more desirably, 0.5 to 1, and hence it is possible to prevent a dark part from occurring between the sealing members 4*a* and 4*b*, and prevent stripe-like luminance unevenness from being caused. In particular, in this embodiment, the surface of the resist layer 48 at the separation part 4*c* between the sealing members 4*a* and 4*b* functions as a reflecting surface having high reflectivity, and hence it is possible to make the dark part between the sealing members 4*a* and 4*b* more inconspicuous.

Further, according to this embodiment, in order to eliminate the angular color difference of the light-emitting device 1, the ratio of the diameter, i.e., the width A of the sealing member 4*a* or 4*b* to the height C thereof is made 2.0 to 7.8:1. Hereby, it is possible to obtain excellent illumination light hardly having an angular color difference.

Furthermore, in the illumination device 100 of this embodiment, the front cover 102 is provided at the lower opening part thereof, whereby it is possible to further diffuse the light in which the luminance unevenness is suppressed, and angular color difference is made inconspicuous as described above, and radiate uniform and high-quality illumination light.

Second Embodiment

Next, a light-emitting device 60 according to a second embodiment will be described below with reference to FIG. 11 and FIG. 12. The light-emitting device 60 of this embodiment has the same structure as the light-emitting device 1 of the first embodiment described above except for that the device 60 has a long and thin intermediate member 62 extending in the longitudinal direction of a substrate 2 on a surface of a resist layer 48 at a separation part 4*c* between sealing members 4*a* and 4*b*. Accordingly, constituent elements functioning in the same manner as the first embodiment are denoted by the same reference symbols, and a detailed description of them will be omitted.

Figure 11:
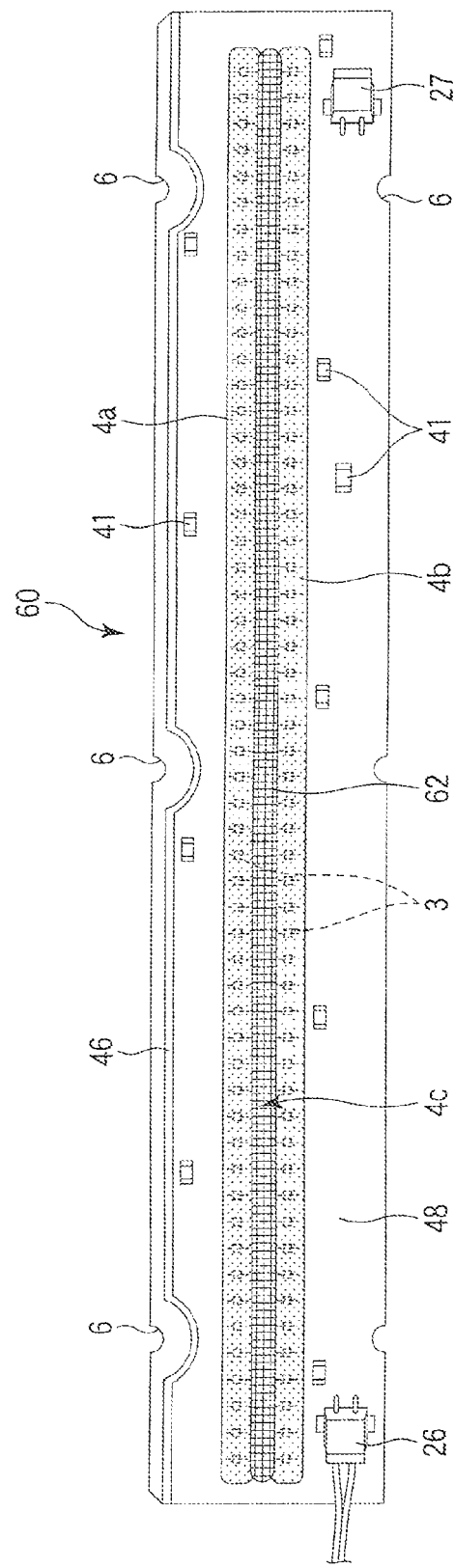
FIG. 11 is a schematic view of a light-emitting device according to a second embodiment viewed from the top surface side.
Figure 12:
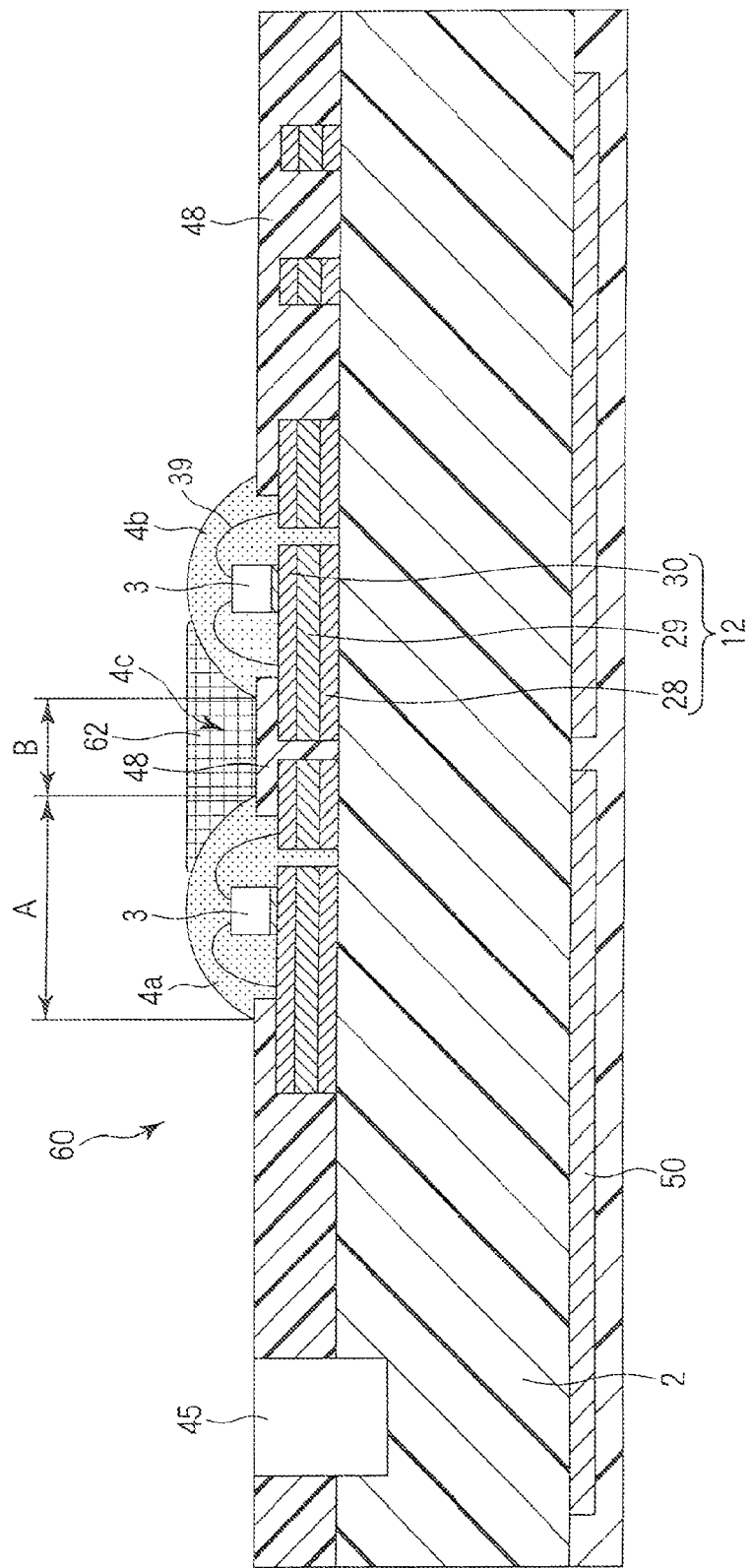
FIG. 12 is a cross-sectional view of the light-emitting device of FIG. 11.

It should be noted that FIG. 11 is a plan view corresponding to FIG. 1, and FIG. 12 is a cross-sectional view corresponding to FIG. 5. Further, two light-emitting devices 60 are connected to each other to be incorporated into an illumination device 100 as shown in FIG. 7 in the same manner as the light-emitting device 1 of the first embodiment.

The intermediate member 62 is configured by applying a silicon resin having translucency to the separation part 4*c* in substantially the same length as the sealing members 4*a* and 4*b* as shown in FIG. 11. That is, the intermediate member 62 is provided to be in close contact with the inner side surface of each sealing member 4*a* or 4*b*, and bury the separation part 4*c*. It should be noted that it is desirable that the height of the surface of the intermediate member 62 be higher than or equal to the height of the top part of each of the sealing members 4a and 4b on both sides thereof.

According to the light-emitting device 60 of this embodiment, part of light emitted from each of the light-emitting elements 3 of each line is made incident on the intermediate member 62. The light made incident on the intermediate member 62 is guided through the intermediate member 62 to be diffused, and part of the diffused light is reflected from the surface of the resist layer at the separation part 4c. The light diffused by the intermediate member 62 including the reflected light is emitted from the surface of the intermediate member 62.

Therefore, according to this embodiment, it is possible, as compared with the first embodiment in which no intermediate member 62 is provided, to further enhance the luminance between the sealing members 4a and 4b, and make the stripe-like luminance unevenness resulting from the dark part at the separation part 4c more inconspicuous.

It should be noted that in this embodiment too, as in the first embodiment, the width B of the separation part 4c is set at a value 0.5 to 2 times the width A of the sealing member 4a or 4b. Further, the width A of the sealing member 4a or 4b is set at a value 2.0 to 7.8 times the height C thereof. As a result, in this embodiment too, it is possible to prevent the luminance unevenness and angular color difference as described above.

In particular, the light-emitting device 60 of this embodiment has the intermediate member 62 between the sealing members 4a and 4b, and hence luminance unevenness is hardly caused even when the width B of the separation part 4c exceeds twice the width A of the sealing member 4a or 4b. That is, by providing the intermediate member 62, it is possible to enhance the luminance at the separation part 4c, and hence there is no possibility of luminance unevenness being caused even when the width B of the separation part 4c is made somewhat larger. In other words, by providing the intermediate member 62, it is possible to slightly widen the width B of the separation part 4c between the sealing members 4a and 4c, and also widen the light distribution range of the illumination device 100.

Third Embodiment

Next, a light-emitting device 70 according to a third embodiment will be described below with reference to FIG. 13. The light-emitting device 70 of this embodiment has substantially the same structure as the light-emitting device 60 of the second embodiment described above except for that the device 70 has no resist layer 48 at a separation part 4c between sealing members 4a and 4b. Accordingly, here, constituent elements functioning in the same manner as the second embodiment are denoted by the same reference symbols, and a detailed description of them will be omitted.

Figure 13:
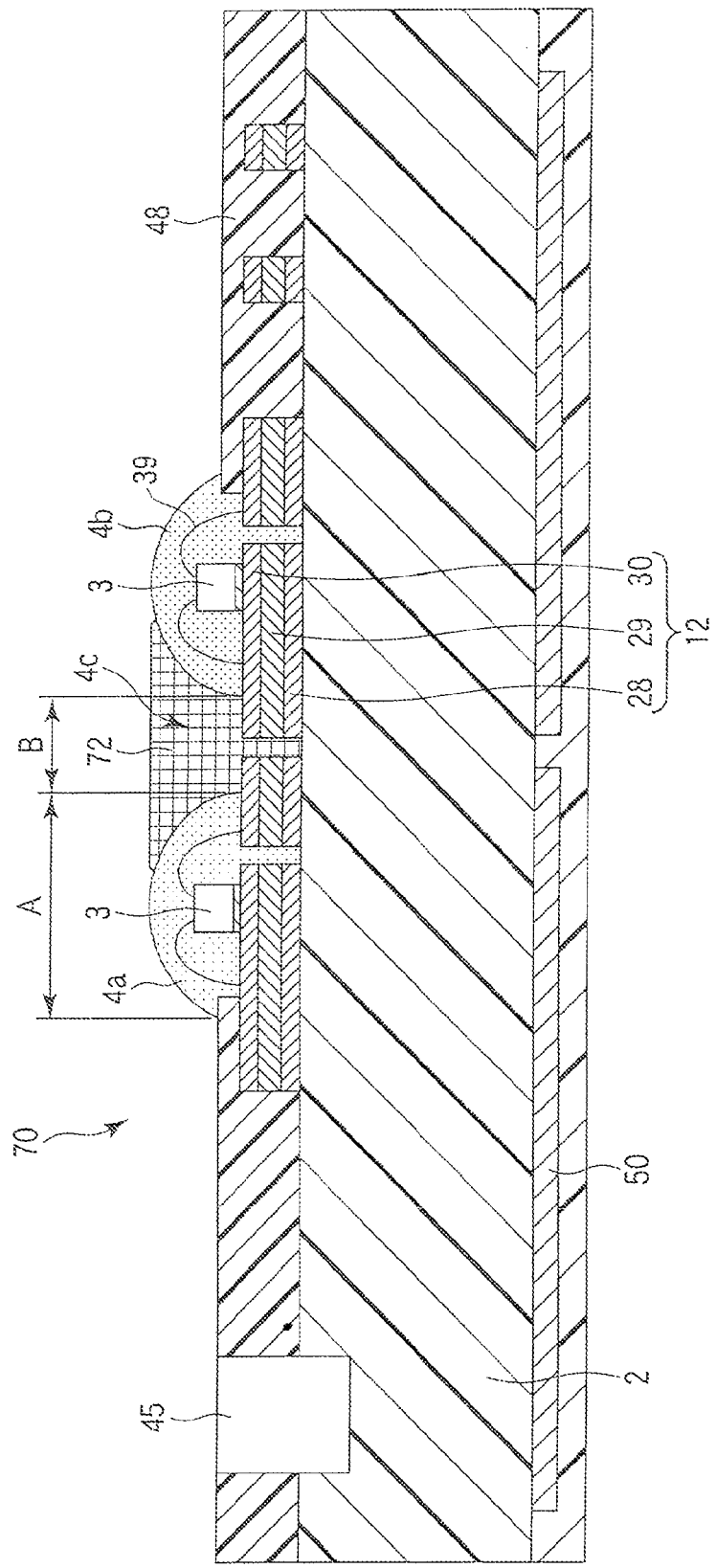
FIG. 13 is a cross-sectional view of a light-emitting device according to a third embodiment.

It should be noted that FIG. 13 is a cross-sectional view corresponding to FIG. 12. Further, two light-emitting devices 70 are also connected to each other to be incorporated into an illumination device 100 as shown in FIG. 7 in the same manner as the light-emitting device 1 of the first embodiment.

In this embodiment, in place of providing a resist layer 48 between the sealing members 4a and 4b, an intermediate member 72 is provided. The intermediate member 72 is, like the intermediate member 62 of the second embodiment described above, formed of a silicon resin having translucency. Further, it is desirable that the height of the surface of the intermediate member 72 be also higher than or equal to the height of the top part of each of the sealing members 4a and 4b on both sides thereof. It should be noted that in this embodiment, the intermediate member 72 is provided in contact with a surface of a silver-plated layer 30 of a pad 12. Accordingly, in this embodiment, part of light made incident on the intermediate member 72, the light being part of light emitted from each of light-emitting elements 3 of each line, is reflected from the surface of the silver-plated layer 30.

That is, according to this embodiment, part of the light made incident on the intermediate member 72 is reflected from the silver-plated layer 30 having higher reflectivity, and it is possible to further enhance the luminance of the intermediate member 72 at the separation part 4c. In particular, according to this embodiment, by providing no resist layer 48 at the separation part 4c, it is possible to reduce the amount of light blocked by the resist layer 48, and further enhance the luminance at the separation part 4c at which the intermediate member 72 is present correspondingly.

It should be noted that in this embodiment too, as in the first embodiment, the width B of, the separation part 4c is set at a value 0.5 to 2 times the width A of the sealing member 4a or 4b. Further, the width A of the sealing member 4a or 4b is set at a value 2.0 to 7.8 times the height C thereof. As a result, in this embodiment too, it is possible to prevent the luminance unevenness and angular color difference described above from being caused.

Fourth Embodiment

Figure 14:
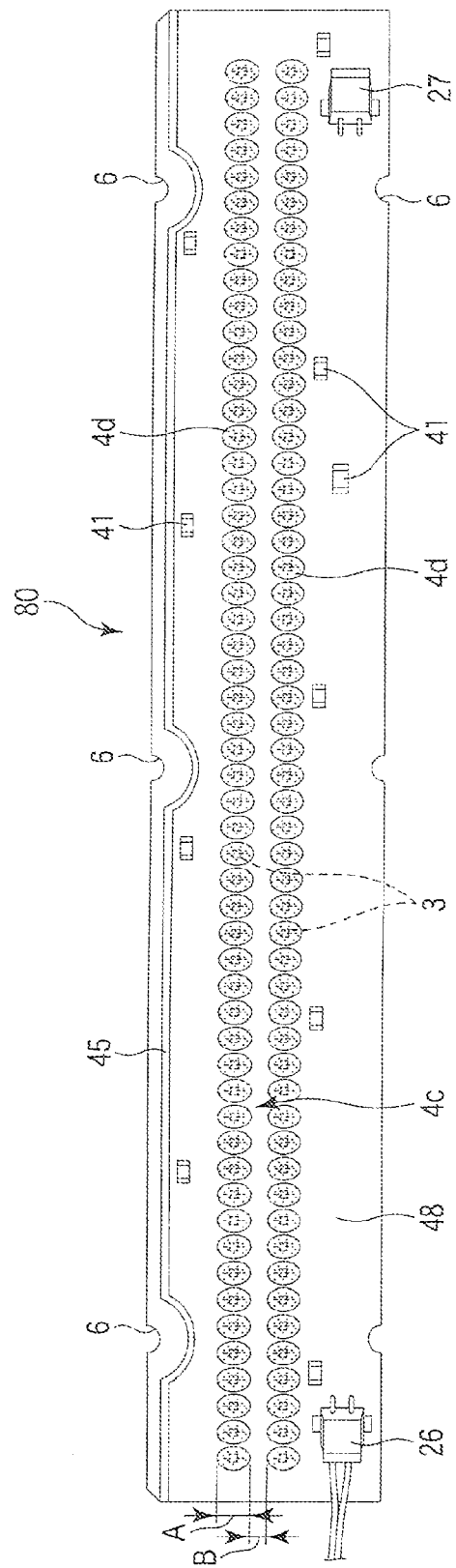
FIG. 14 is a schematic view of a light-emitting device according to a fourth embodiment viewed from the top surface side.

Next, a light-emitting device 80 according to a fourth embodiment will be described below with reference to FIG. 14. The light-emitting device 80 of this embodiment has substantially the same structure as the light-emitting devise 1 of the aforementioned first embodiment except for that the device 80 is provided with, in place of the sealing members 4a and 4b, sealing members 4d configured to individually cover and seal light-emitting elements 3. Accordingly, parts identical with or corresponding to those of the first embodiment are denoted by the identical reference symbols, and a duplicate description will be omitted.

The plurality of sealing members 4d individually sealing the light-emitting elements 3 have the same shape and size, and are applied to a substrate 2 in two lines in a longitudinal direction of the substrate 2. That is, widths A or heights C of the sealing members 4d in a lateral direction (width direction) of the substrate 2 are all of the same size. Further, in this case, a separation part 4c between each line of the sealing members 4d is set at a width B as shown in FIG. 14.

In this embodiment too, as in the first embodiment, the width B of the separation part 4c is set at a value 0.5 to 2 times the width A of the sealing member 4a or 4b. Further, the width A of the sealing member 4a or 4b is set a value 2.0 to 7.8 times the height C thereof. As a result, in this embodiment too, it is possible to exert the advantages identical with the first embodiment, and prevent the aforementioned luminance unevenness and angular color difference.

In particular, according to this embodiment, the sealing members 4d are provided for all the light-emitting elements 3 in a studding manner, and hence it is possible, as compared with the first embodiment, to reduce the amount of the material for the sealing-members, and also reduce the material cost correspondingly.

It should be noted that in this embodiment, although the sealing member 4d is provided for each light-emitting element 3, the configuration is not limited to this, and the plurality of light-emitting elements may be divided into blocks, and each block may be sealed with a sealing member.

Fifth Embodiment

Figure 15:
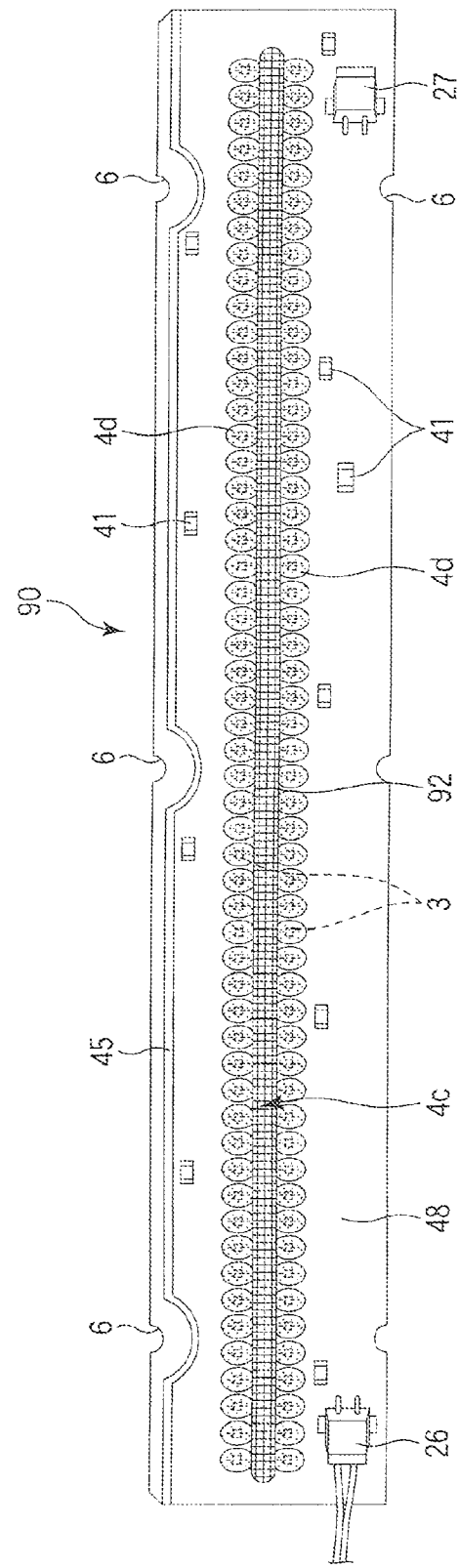
FIG. 15 is a schematic view of a light-emitting device according to a fifth embodiment viewed from the top surface side.

FIG. 15 shows a plan view of a light-emitting device 90 according to a fifth embodiment. The light-emitting device 90 has the same structure as the light-emitting device 80 of the aforementioned fourth embodiment except for that an intermediate member 92 identical with the intermediate member 62 of the aforementioned second embodiment is provided between lines of sealing members 4d. Accordingly, here, constituent elements functioning in the same manner as the light-emitting device 80 of the fourth embodiment are denoted by the same reference symbols, and a detailed description of them will be omitted.

In this embodiment too, as in the first embodiment, the width B of a separation part 4c is set at a value 0.5 to 2 times the width A of the sealing member 4a or 4b. Further, the width A of the sealing member 4a or 4b is set at a value 2.0 to 7.8 times the height C thereof. As a result, in this embodiment too, it is possible to exert the advantages identical with the aforementioned first embodiment, and prevent the aforementioned luminance unevenness and angular color difference.

Further, according to this embodiment, in addition to that it is possible to exert the advantages identical with the light-emitting device 80 of the fourth embodiment, it is possible, by providing the intermediate member 92, to further enhance the luminance at the separation part 4c, and slightly widen the part between the lines of the sealing members 4d as in the second embodiment.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

For example, in the aforementioned embodiments, although the intermediate members 62, 72, and 92 are formed of a silicon resin having translucency, the material for the intermediate member is not limited to this material, and other transparent resins such as an acrylic resin, and the like may be used. Any material may be used so long as the material can reduce a difference in relative luminance between the sealing members 4a, 4b, and 4d used for sealing the light emitting element 3.

Further, in the aforementioned embodiments, although the intermediate member 62, 72 or, 92 is formed by applying a silicon resin having fluidity to the separation part 4c, the formation method thereof is not limited to this, and the intermediate member may be formed by using a hard material having no fluidity. In this case, it is sufficient if the sealing member 4a, 4b, or 4d with which the intermediate member is in contact is formed of a material having elasticity. As a result, it is possible to enhance the adhesion between the intermediate member and sealing member.

Further, in the above-mentioned embodiments, although the intermediate member 62, 72 or 92 is formed by simply using a transparent silicon resin, a diffusing agent may be mixed into the intermediate member. Examples of the diffusing agent include, for example, alumina, silica, and the like. As described above, by mixing the diffusing agent into the intermediate member 62, 72 or 82, it is possible to enhance the diffusion effect of the intermediate member.

Furthermore, the illumination device can be applied to a lighting fixture to be used indoors or outdoors, light source of a display device, and the like.

What is claimed is:

1. A light-emitting device comprising:
   a plurality of light-emitting elements;
   a substrate formed of a synthetic resin material and having an even surface, on which the plurality of light-emitting elements are directly mounted in a plurality of lines; and
   a plurality of sealing members that seal the plurality of light-emitting elements along the lines on the even surface, each of the sealing members having a cross sectional shape that is a flat mountain shape and an arc-shaped light-emitting face, wherein:
   a distance between the sealing members in adjacent lines is equal to 0.5 times or more but 2 times or less a width of each of the sealing members;
   the width of each of the sealing members is equal to 2.0 times or more, but 7.8 times or less, a height of each of the sealing members; and
   within a range where an emission angle of a light from each of the light-emitting elements relative to a direction perpendicular to the even surface is from 0° to 75°, a correlated color temperature difference is equal to 1000K or less.

2. The light-emitting device according to claim 1, further comprising:
   an intermediate member arranged between the adjacent lines of the sealing member and includes a reflecting surface configured to reflect light emitted through the adjacent sealing members in a frontward direction.

3. The light-emitting device according to claim 2, wherein the intermediate member is formed of a transparent resin.

4. The light-emitting device according to claim 3, wherein the intermediate member contains therein a diffusing agent such as alumina, silica or the like.

5. An illumination device comprising:
   a device main body; and
   a light-emitting device of claim 4 arranged in the device main body.

6. The illumination device according to claim 5, further comprising a front cover possessing light-diffusing properties, attached to the device main body to cover a front surface of the light-emitting device.

7. An illumination device comprising:
   a device main body; and
   a light-emitting device of claim 3 arranged in the device main body.

8. The illumination device according to claim 7, further comprising a front cover possessing light-diffusing properties, attached to the device main body to cover a front surface of the light-emitting device.

9. An illumination device comprising:
   a device main body; and
   a light-emitting device of claim 2 arranged in the device main body.

10. The illumination device according to claim 9, further comprising a front cover possessing light-diffusing properties, attached to the device main body to cover a front surface of the light-emitting device.

11. An illumination device comprising:
    a device main body; and
    a light-emitting device of claim 1 arranged in the device main body.

12. The illumination device according to claim 11, further comprising a front cover possessing light-diffusing properties, attached to the device main body to cover a front surface of the light-emitting device.

* * * * *